(12) United States Patent
Morioka

(10) Patent No.: US 11,323,113 B2
(45) Date of Patent: May 3, 2022

(54) CURRENT FLOW CONTROL DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Hideo Morioka, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 120 days.

(21) Appl. No.: 16/639,862

(22) PCT Filed: Aug. 23, 2018

(86) PCT No.: PCT/JP2018/031178
§ 371 (c)(1),
(2) Date: Feb. 18, 2020

(87) PCT Pub. No.: WO2019/044657
PCT Pub. Date: Mar. 7, 2019

(65) Prior Publication Data
US 2020/0366282 A1 Nov. 19, 2020

(30) Foreign Application Priority Data
Aug. 31, 2017 (JP) .............................. JP2017-167995

(51) Int. Cl.
*H03K 3/00* (2006.01)
*H03K 5/22* (2006.01)
(Continued)

(52) U.S. Cl.
CPC ............. *H03K 17/122* (2013.01); *H02H 7/20* (2013.01); *H02J 7/0029* (2013.01);
(Continued)

(58) Field of Classification Search
None
See application file for complete search history.

(56) References Cited

U.S. PATENT DOCUMENTS

| | | | |
|---|---|---|---|
| 6,304,108 B1* | 10/2001 | Inn | H03F 3/345 327/543 |
| 6,472,910 B2* | 10/2002 | Niimi | H03K 17/063 327/108 |

(Continued)

FOREIGN PATENT DOCUMENTS

| | | |
|---|---|---|
| JP | 2011-254650 A | 12/2011 |
| JP | 2012-080723 A | 4/2012 |

(Continued)

OTHER PUBLICATIONS

International Search Report, Application No. PCT/JP2018/031178, dated Nov. 13, 2018. ISA/Japan Patent Office.

*Primary Examiner* — Kenneth B Wells
(74) *Attorney, Agent, or Firm* — Honigman LLP

(57) ABSTRACT

A current flow control device includes a plurality of semiconductor switches disposed between a power source and a load and that are connected in parallel with each other, and the current flow control device being configured to control the flow of current between the power source and the load by turning on and off the semiconductor switches. The plurality of semiconductor switches include a first and a second semiconductor switch. The current flow control device includes a driving circuit configured to apply, to the first semiconductor switch, a voltage that is higher than a voltage output from the power source, to turn on the first semiconductor switch, a switch control unit configured to turn on the second semiconductor switch, and a resistor that is connected in series with a terminal on the power source (Continued)

side of the second semiconductor switch, the resistor lowering a voltage applied to the terminal.

8 Claims, 6 Drawing Sheets

(51) Int. Cl.
| | |
|---|---|
| *H03F 1/52* | (2006.01) |
| *H02H 3/08* | (2006.01) |
| *H03K 17/12* | (2006.01) |
| *H02H 7/20* | (2006.01) |
| *H02J 7/00* | (2006.01) |
| *H03K 17/082* | (2006.01) |
| *H03K 17/10* | (2006.01) |
| *H03K 17/687* | (2006.01) |

(52) U.S. Cl.
CPC ....... *H03K 17/0822* (2013.01); *H03K 17/102* (2013.01); *H03K 17/687* (2013.01)

(56) References Cited

U.S. PATENT DOCUMENTS

| | | | |
|---|---|---|---|
| 7,075,373 B2* | 7/2006 | Briskin | H03F 1/523 |
| | | | 330/298 |
| 7,710,701 B1* | 5/2010 | Mei | H02H 7/1213 |
| | | | 361/93.1 |
| 2013/0106320 A1 | 5/2013 | Yugo | |

FOREIGN PATENT DOCUMENTS

| | | |
|---|---|---|
| JP | 2014-017990 A | 1/2014 |
| JP | 2014-239132 A | 12/2014 |
| JP | 2017-028213 A | 2/2017 |

* cited by examiner

CURRENT FLOW CONTROL DEVICE

CROSS-REFERENCE TO RELATED APPLICATIONS

This application is the U.S. national stage of PCT/JP2018/031178 filed on Aug. 23, 2018, which claims priority of Japanese Patent Application No. JP 2017-167995 filed on Aug. 31, 2017, the contents of which are incorporated herein.

TECHNICAL FIELD

The present disclosure relates to a current flow control device.

BACKGROUND

Currently, vehicles are provided with a large number of electric devices (loads) such as an interior light, a heater, and a wiper that are supplied with power from a power source (battery). Current flow from the power source, that is, supply of power to the loads is controlled by a current flow control device (power supply control device; see JP 2014-239132A).

Semiconductor switches in the current flow control device disclosed in JP 2014-239132A are connected in parallel with a current path that runs from a power source to a load. The current flow control device is provided with a driving circuit (drive circuit) for driving the semiconductor switches that are connected in parallel with each other.

The semiconductor switches disclosed in JP 2014-239132A are n-channel FETs, and the load is connected on the ground side with respect to the semiconductor switches. Since an on-resistance of a semiconductor switch is generally very small compared to the resistance of a load, the value of the voltage that is output from a power source is substantially the same as a potential difference between both ends of the load, that is, the value of the voltage drop due to the load.

Accordingly, the source side voltage value of the n-channel FET, that is, the potential difference to the ground as a reference potential, is substantially the same as the value of the voltage that is output from the power source. In order to turn on the semiconductor switch that is an n-channel FET, it is necessary to apply, to the gate terminal of the n-channel FET, a voltage obtained by adding a threshold voltage that depends on the characteristics of the semiconductor switch, to the source side voltage value. A driving circuit generates, by boosting, a voltage obtained by adding the threshold voltage value to the source-side voltage value, that is, a voltage that is higher than a voltage output from the power source, and the driving circuit applies the boosted voltage to the gate terminal of the n-channel FET. The driving circuit is generally referred to as a bootstrap circuit.

In order to provide driving circuits corresponding to semiconductor switches, the driving circuits of the number of the semiconductor switches need to be provided, which makes the circuit configuration complicated. Meanwhile, if a configuration is used in which a single driving circuit is provided to the semiconductor switches, the output from the single driving circuit is branched in parallel, and a voltage is applied to each semiconductor switch, if there is an abnormality in that single driving circuit, boosting cannot be performed and none of the semiconductor switches can be turned on.

SUMMARY

An object of the present disclosure is to provide a current flow control device that supplies power to a load even if there is an abnormality in a driving circuit that performs boosting.

A current flow control device according to an aspect of the present disclosure includes a plurality of semiconductor switches that are provided between a power source and a load and that are connected in parallel with each other, the current flow control device being configured to control the flow of current between the power source and the load by turning on and off the semiconductor switches, and the plurality of semiconductor switches include a first semiconductor switch and a second semiconductor switch, and the current flow control device includes a driving circuit configured to apply, to the first semiconductor switch, a voltage that is higher than a voltage that is output from the power source, to turn on the first semiconductor switch; a switch control unit configured to turn on the second semiconductor switch; and a resistor that is connected in series with a terminal on the power source side of the second semiconductor switch, the resistor lowering a voltage applied to the terminal.

Advantageous Effect of the Present Disclosure

According to the present disclosure, a current flow control device is provided which can supply power to a load even if there is an abnormality in a driving circuit that performs boosting.

DETAILED DESCRIPTION OF EMBODIMENTS OF THE PRESENT DISCLOSURE

Figure 1:
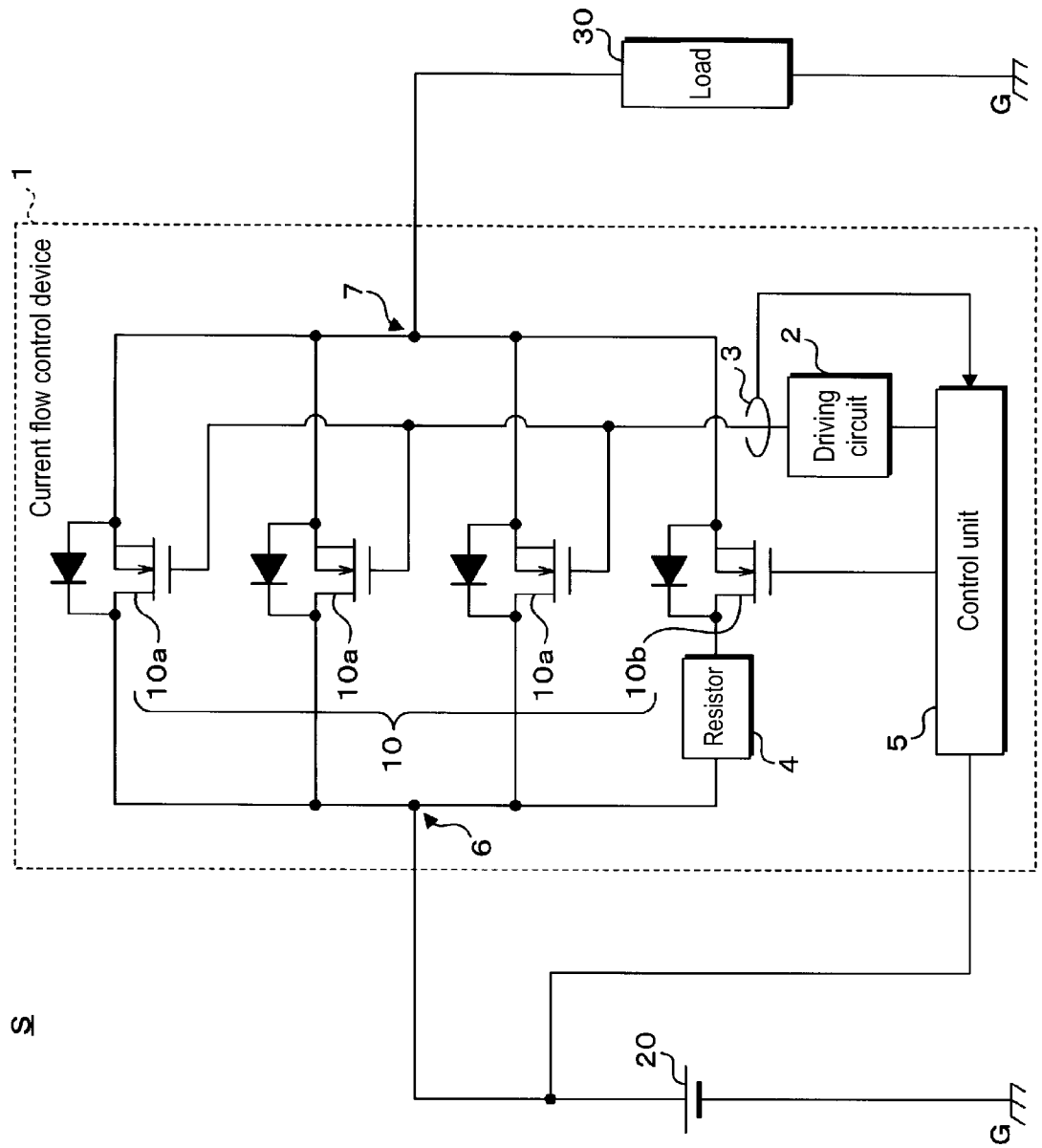
FIG. 1 is a block diagram showing a configuration of a main part of a power supply system according to a first embodiment.

First, embodiments of the present disclosure will be listed and illustrated. Additionally, at least a part of the embodiments that will be disclosed hereinafter can be combined as necessary.

A current flow control device according to an aspect of the present disclosure includes a plurality of semiconductor switches that are provided between a power source and a load and that are connected in parallel with each other, the current flow control device being configured to control the flow of current between the power source and the load by turning on and off the semiconductor switches, and the plurality of semiconductor switches include a first semiconductor switch and a second semiconductor switch, and the current flow control device includes: a driving circuit configured to apply, to the first semiconductor switch, a voltage that is higher than a voltage that is output from the power source, to turn on the first semiconductor switch; a switch control unit configured to turn on the second semiconductor switch; and a resistor that is connected in series with a terminal on the power source side of the second semiconductor switch, the resistor lowering a voltage applied to the terminal.

In this aspect, since the resistor is provided between the terminal on the power source side of the second semiconductor switch and a connection node of the first semiconductor switch and the second semiconductor switch, a voltage value applied to turn on the second semiconductor switch is lower than the voltage value of the power source by a voltage drop due to the resistor, and the switch control unit turns on the second semiconductor switch. Accordingly, when the first semiconductor switch is off, it is no longer necessary to boost the voltage to be higher than the voltage value of the power source to turn on the second semiconductor switch, and thus power can be supplied to the load even if there is an abnormality in the driving circuit that performs boosting.

A configuration is preferable in which a current capacity of the second semiconductor switch is smaller than a current capacity of the first semiconductor switch.

In this aspect, since the resistor is provided between the terminal on the power source side of the second semiconductor switch and the connection node of the first semiconductor switch and the second semiconductor switch, the amount of a current flowing through the second semiconductor switch is reduced due to the resistor. Accordingly, by using the semiconductor switch having a smaller current capacity than the current capacity of the first semiconductor switch for the second semiconductor switch, an inexpensive current flow control device can be provided.

A configuration is preferable in which an on-resistance of the second semiconductor switch is greater than an on-resistance of the first semiconductor switch.

In this aspect, since the on-resistance of the second semiconductor switch is greater than the on-resistance of the first semiconductor switch, by the combined resistance of the on-resistance of the second semiconductor switch and the resistor connected in series therewith, the potential on the source side of the second semiconductor switch can be further lowered. Accordingly, when the first semiconductor switch is off, it is no longer necessary to boost the voltage to be higher than the voltage value of the power source in order to turn on the second semiconductor switch.

A configuration is preferable in which, in a state where the first semiconductor switch is turned off and the second semiconductor switch is turned on, a value of a voltage drop due to the resistor is greater than a threshold voltage for turning on the second semiconductor switch.

In this aspect, since the value of voltage drop due to the resistor is set to be greater than the threshold voltage to turn on the second semiconductor switch, the voltage value obtained by adding the threshold voltage to the voltage value obtained by subtracting the value of voltage drop due to the resistor from the voltage value of the power source, is lower than the voltage value of the power source. Accordingly, it is no longer necessary to boost the voltage to be higher than the voltage value of the power source in order to turn on the second semiconductor switch.

A configuration is preferable in which the current flow control device includes an abnormality detection unit configured to detect an abnormality in the driving circuit, and if the abnormality detection unit detects an abnormality in the driving circuit, the switch control unit turns on the second semiconductor switch.

In this aspect, even if the voltage of the power source cannot be boosted due to an abnormality in the above-described driving circuit and the first semiconductor switch cannot be turned on, since it is possible to turn on the second semiconductor switch at the voltage value that is less than or equal to that of the power source, it is no longer necessary to boost the voltage value to be higher than the voltage value of the power source in order to turn on the second semiconductor switch. Accordingly, even if the first semiconductor switch cannot be turned on, it is possible to supply power from the power source to the load via the second semiconductor switch.

A power supply system configured to supply power to a load, the power supply system includes: a power source; a first semiconductor switch and a second semiconductor switch that are provided between the power source and the load, and that are connected in parallel with each other; a driving circuit configured to apply, to the first semiconductor switch, a voltage that is higher than a voltage output from the power source; a control unit configured to turn on the second semiconductor switch; and a resistor that is connected in series with a terminal on the power source side of the second semiconductor switch, the resistor lowering a voltage applied to the terminal.

In this aspect, since the resistor is provided between the terminal on the power source side of the second semiconductor switch and the connection node of the first semiconductor switch and the second semiconductor switch, a voltage value to be applied to turn on the second semiconductor switch is lowered than the voltage value of the power source by voltage drop due to a resistor, and the switch control unit turns on the second semiconductor switch. Accordingly, if the first semiconductor switch is off, it is no longer necessary to boost the voltage to be higher than the voltage value of the power source in order to turn on the second semiconductor switch, and power can be supplied to the load even if there is an abnormality in the driving circuit that performs boosting.

Specific examples of the current flow control device according to embodiments of the present disclosure will be described hereinafter with reference to the drawings. Note that the present disclosure is not limited to these illustrations, but rather is indicated by the claims. All modifications within the meaning and range of equivalency to the claims are intended to be encompassed therein.

First Embodiment

Hereinafter, an embodiment will be described with reference to the drawings. FIG. 1 is a block diagram showing a configuration of a main part of a power supply system S according to a first embodiment. The power supply system S is provided with a first power source 20, a load 30, and a current flow control device 1, is installed in a vehicle (not shown) for example, and supplies power from the first power source 20 to an in-vehicle device that serves as the load 30. The current flow control device 1 is provided between the first power source 20 and the load 30, and controls supply and interruption of power from the first power source 20 to the load 30.

The first power source 20 is a secondary battery such as a lead battery or a lithium ion battery, and functions as a constant-voltage power source that outputs a voltage of 12 V, for example.

The load 30 is an in-vehicle device such as an interior light using a light emitting element such as an LED, a door-locking mechanism using a DC motor, or the like.

The current flow control device 1 is provided with a plurality of semiconductor switches 10 in which first semiconductor switches 10a and a second semiconductor switch 10b are connected in parallel with each other, a driving circuit 2 for turning on the first semiconductor switches 10a, and a control unit 5 for outputting control signals for turning on or off the plurality of semiconductor switches 10.

The first semiconductor switches 10a are n-channel FETs (Field effect transistors). Three of the first semiconductor switches 10a are connected in parallel with each other. The first semiconductor switches 10a are not limited to n-channel FETs, and may also be npn-channel bipolar transistors, or n-channel IGBTs (Insulated Gate Bipolar Transistors). The number of first semiconductor switches 10a arranged in parallel is not limited to three, and may be determined as appropriate in accordance with the value of current flowing through the first semiconductor switches 10a, and the electric characteristics of the first semiconductor switches 10a such as on-resistance or maximum drain current.

The second semiconductor switch 10b is an n-channel FET. Similarly to the three first semiconductor switches 10a, the one second semiconductor switch 10b is connected in parallel with the first semiconductor switches 10a. Accordingly, the plurality of semiconductor switches 10 are connected such that four semiconductor switches are in parallel with each other. The second semiconductor switch 10b is not limited to an n-channel FET, and may also be an npn-channel bipolar transistor, or an n-channel IGBT. The number of second semiconductor switches 10b is not limited to one, and may be determined as appropriate in accordance with the value of a current flowing through the second semiconductor switch 10b, and the electric characteristics of the second semiconductor switch 10b such as on-resistance or maximum drain current, and similarly to the first semiconductor switches 10a, the second semiconductor switches 10b may be connected in parallel depending on the number of second semiconductor switches 10b arranged in parallel.

Since a resistor 4, which will be described later, is connected in series on the power source side of the second semiconductor switch 10b, the current capacity of the second semiconductor switch 10b is smaller than that of the first semiconductor switches 10a. As such, an inexpensive semiconductor switch can be used for a second semiconductor switch 10b. Additionally, the resistance value of the on-resistance of the second semiconductor switch 10b is higher than that of the on-resistance of the first semiconductor switches 10a.

The drain terminals of the plurality of semiconductor switches 10 are connected to the first power source 20, and the source terminals are connected to the load 30. Accordingly, a first power source side connection node 6 that serves as the connection node of the first semiconductor switches 10a and the second semiconductor switch 10b on the first power source 20 side is located on the drain terminal side. A load side connection node 7 that serves as the connection node of the first semiconductor switches 10a and the second semiconductor switch 10b on the load 30 side is located on the source terminal side.

The driving circuit 2 is provided between the control unit 5 and the gate terminals of the first semiconductor switches 10a. The driving circuit 2 and the gate terminals are connected to each other by wires that are branched in parallel in accordance with the number of the gate terminals. Accordingly, it is possible to turn on the three first semiconductor switches 10a simultaneously with a single driving circuit 2, thus making it possible to simplify the circuit configuration. The driving circuit 2 applies a voltage for turning on the first semiconductor switches 10a to the gate terminals of the first semiconductor switches 10a, in accordance with the control signal output from the control unit 5.

The driving circuit 2 has a boosting function. The value of voltage for turning on the first semiconductor switches 10a needs to be higher than the voltage value of the source terminals of the first semiconductor switches 10a by the threshold voltage, which depends on the characteristics of the first semiconductor switches 10a. Since the load 30 is provided between the first semiconductor switches 10a and the ground that serves as the reference potential, the voltage value of the source terminals is substantially the same as the voltage value of the drain terminals, that is, the output voltage value of the first power source 20. Accordingly, the driving circuit 2 boosts the voltage to be higher than the output voltage value of the first power source 20 by the threshold voltage, and applies the boosted voltage to the gate terminals of the first semiconductor switches 10a.

The control unit 5 includes a CPU (central processing unit), and performs control processing by executing control programs stored in a ROM (Read Only Memory) which is not shown. The control unit 5 controls the plurality of semiconductor switches 10 to be turned on or off based on instructions from a body ECU (Electronic Control Unit, not shown) that controls the entirety of the vehicle, and controls current flow between the first power source 20 and the load 30, for example. The control unit 5 corresponds to a switch control unit and an abnormality detection unit.

When supplying power to the load 30, the control unit 5 turns on the plurality of semiconductor switches 10 including the first semiconductor switches 10a and the second semiconductor switch 10b simultaneously. When turning on the first semiconductor switches 10a, the control unit 5 outputs the control signal to the driving circuit 2. When turning on the second semiconductor switch 10b, the control unit 5 outputs the control signal to the second semiconductor switch 10b. Since the plurality of semiconductor switches 10 are connected in parallel with each other, the value of the combined resistance constituted by the on-resistances of the plurality of semiconductor switches 10 can be smaller. Furthermore, since a current flow can be branched in accordance with the number of parallel connections, the value of each current flowing through the plurality of semiconductor switches 10 can be smaller. Or, when supplying power to the load 30, the control unit 5 may also turn on the first semiconductor switches 10a and turn off the second semiconductor switch 10b. Since the later-described resistor 4 is connected in series with the second semiconductor switch 10b, heat loss due to the resistor 4 can be suppressed by turning on only the first semiconductor switches 10a.

The driving voltage detection unit 3 detects the value of the voltage applied to the gate terminals of the first semiconductor switches 10a from the driving circuit 2, and outputs the detected voltage value to the control unit 5. The control unit 5 obtains the voltage value detected by the driving voltage detection unit 3, and detects any abnormality in the driving circuit 2 by determining whether the obtained voltage value has been boosted to the voltage value for turning on the first semiconductor switches 10a. Note that it is also possible to provide a detection unit that detects the value of current flowing through the first semiconductor switches 10a, the potential difference between the drain terminal and the source terminal of the first semiconductor switches 10a, or the voltage of the source terminal (potential difference between the source terminal and the ground that serves as the reference potential). The detection unit may also output the detection result to the control unit 5, and the control unit 5 may also detect any abnormality in the driving circuit 2 based on the detected current value, for example. If the value of the current flowing through the first semiconductor switches 10a is smaller than a prescribed value despite that the control unit 5 outputs the control signal for turning on the first semiconductor switches 10a to the driving circuit 2, boosting is not sufficiently performed by the driving circuit 2.

The resistor 4 is connected in series between the second semiconductor switch 10b and the first power source side connection node 6. The resistance value of the resistor 4 is set such that, in a state where the first semiconductor switches 10a are turned off and the second semiconductor switch 10b is turned on, the value of the voltage drop due to the resistor 4 is greater than the threshold voltage for turning on the second semiconductor switch 10b. Or, the resistance values of the resistor 4 and the second semiconductor switch 10b may also be set such that the value of the voltage drop due to the combined resistance of the resistor 4 and the on-resistance of the second semiconductor switch 10b is greater than the threshold voltage for turning on the second semiconductor switch 10b.

Let us assume that the resistance value of the resistor 4 is 49Ω, and the value of the on-resistance of the second semiconductor switch 10b is 0.5Ω, for example. The load 30 is, for example, a circuit constituted by a light-emitting element 42 such as an LED, and the voltage drop value is 2 V. In this case, the voltage drops by approximately 9.9 V due to the resistor 4 when a voltage of 12 V is output from the first power source 20. The threshold voltage of the second semiconductor switch 10b is 2 V, for example, and the voltage drop value is set greater than the threshold value of the second semiconductor switch 10b. The second semiconductor switch 10b can be turned on by applying, to the gate terminal of the second semiconductor switch 10b, a voltage of approximately 4 V obtained by adding the 2 V of the threshold voltage to 2 V that is the source-side voltage of the second semiconductor switch 10b. Since the control unit 5 is electrically connected to the first power source 20, the control unit 5 can output a voltage lower than the voltage output from the first power source 20. Since the second semiconductor switch 10b can be turned on by a voltage lower than the voltage output from the first power source 20, it is no longer necessary to boost the voltage to be higher than the voltage output from the first power source 20. Accordingly, in a state where the first semiconductor switches 10a are turned off, it is possible to turn on the second semiconductor switch 10b without using the driving circuit 2 having a boosting function, let current flow between the first power source 20 and the load 30, and supply power from the first power source 20 to the load 30.

Additionally, if the first semiconductor switches 10a are turned off and the second semiconductor switch 10b is turned on, the value of the current flowing on the load 30 side decreases due to the resistor 4. Accordingly, if it is suspected that there is a malfunction such as a short circuit on the load 30 side, the first semiconductor switches 10a are turned off and the second semiconductor switch 10b is turned on, and thus a current having a small current value (small current) flows through on the load 30 side and a large current is prevented from flowing therethrough, and in this state, a malfunction diagnosis such as specifying the short circuit position or performing a current flow test can be performed.

Figure 2:
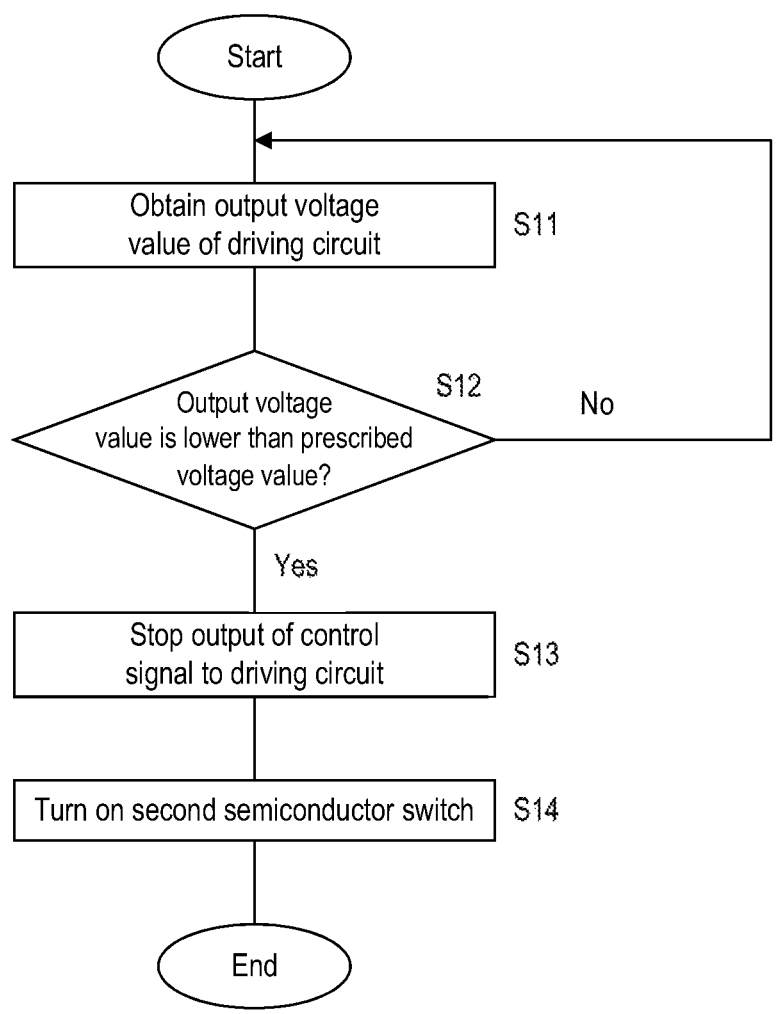
FIG. 2 is a flowchart showing a processing procedure performed by a control unit according to the first embodiment.

FIG. 2 is a flowchart showing a processing procedure performed by the control unit 5 according to the first embodiment. When the control unit 5 of the current flow control device 1 outputs the control signal to the driving circuit 2, the control unit 5 constantly executes the processing procedure described below.

The control unit 5 obtains the value of the voltage output from the driving circuit 2 to the gate terminals of the first semiconductor switches 10a (S11). The control unit 5 detects an abnormality in the driving circuit 2 by determining whether the obtained voltage value is lower than a prescribed voltage value, that is, the voltage value for turning on the first semiconductor switches 10a (S12). If the obtained voltage value is at least to the prescribed voltage value (S12: NO), the control unit 5 does not detect an abnormality in the driving circuit 2 and returns the procedure to S11.

If the obtained voltage value is lower than the prescribed voltage value (S12: YES), the control unit 5 detects an abnormality in the driving circuit 2. If the obtained voltage value is lower than the prescribed voltage value, it means that boosting is not sufficiently performed by the driving circuit 2. As such, if the obtained voltage value is lower than the prescribed voltage value despite that the control signal for turning on the first semiconductor switches 10a is output from the control unit 5 to the driving circuit 2, there is an abnormality in the driving circuit 2. The control unit 5 stops output of the control signal for turning on the first semiconductor switches 10a to the driving circuit 2 (S13). Due to the output of the control signal to the driving circuit 2 being stopped, the first semiconductor switches 10a are turned off.

The control unit 5 outputs the control signal for turning on the second semiconductor switch 10b (S14). The control signal output from the control unit 5 to the second semiconductor switch 10b is a voltage to be applied to the gate terminal of the second semiconductor switch 10b for turning on the second semiconductor switch 10b. The value of the voltage to be applied to the gate terminal of the second semiconductor switch 10b is the voltage value obtained by adding the threshold voltage of the second semiconductor switch 10b to the voltage value on the source terminal side of the second semiconductor switch 10b. Since the voltage drop value of the resistor 4 connected in series on the first power source 20 side of the second semiconductor switch 10b is greater than the threshold voltage of the second semiconductor switch 10b, the second semiconductor switch 10b can be turned by to a voltage lower than the voltage output from the first power source 20.

Accordingly, even if there is an abnormality in the driving circuit 2 for turning on the first semiconductor switches 10a and the first semiconductor switches 10a cannot be turned on, the second semiconductor switch 10b can be turned on and power can be supplied from the first power source 20 to the load 30.

Second Embodiment

Figure 3:
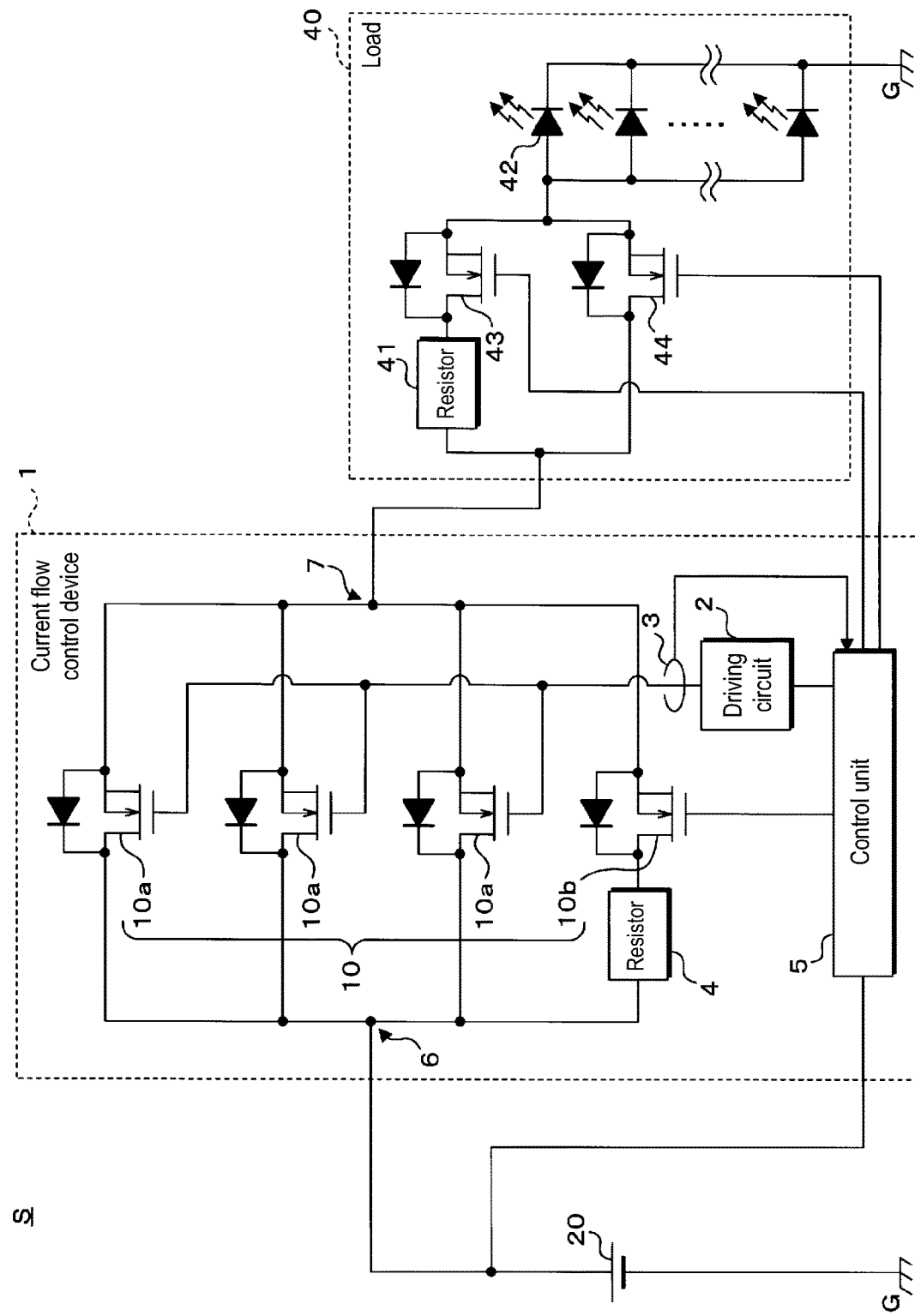
FIG. 3 is a block diagram showing a configuration of a main part of a power supply system according to a second embodiment.

FIG. 3 is a block diagram showing a configuration of a main part of a power supply system S according to a second embodiment. The second embodiment has the same configurations as the current flow control device 1 of the first embodiment, aside from that a lighting circuit 40 is provided as the load 30, and the control unit 5 outputs the control signal for turning on or off the lighting circuit 40. Since the other configurations, operations and effects are the same as in the first embodiment, the same reference signs are given to the corresponding parts, and the description thereof will be omitted.

The lighting circuit 40 is provided with a light emitting element 42 such as an LED and a third semiconductor switch 43 and a fourth semiconductor switch 44 that are connected in parallel with each other for turning on or off the light emitting element 42, and used in a light device such as an interior light of a vehicle, for example.

The third semiconductor switch 43 and the fourth semiconductor switch 44 are n-channel FETs. Note that the third semiconductor switch 43 and the fourth semiconductor switch 44 are not limited to n-channel FETs, and may also be n-channel bipolar transistors, n-channel IGDPs, or p-channel semiconductor switches. The on-resistance of the third semiconductor switch 43 is 0.002Ω, and the on-resistance of the fourth semiconductor switch 44 is 0.5Ω, for example.

The light emitting element 42 is provided between a connection node of third semiconductor switch 43 and the fourth semiconductor switch 44 on the ground (reference potential) side, and the ground. The voltage drops by 2 V when a current of 20 mA flows to the light emitting element 42, for example, and the ten light emitting elements 42 are connected in parallel with each other (not shown). Accordingly, the sum of the values of the currents flowing through the ten LEDs is 0.2 A.

A lighting circuit resistor 41 is connected in series with the third semiconductor switch 43 between a connection node of the third semiconductor switch 43 and the fourth semiconductor switch 44 on the current flow device side, and the third semiconductor switch 43. The resistance value of the lighting circuit resistor 41 is set to 50 Ω such that a current of 0.2 A flows through the LEDs due to a voltage of 12 V output from the first power source 20.

If the control unit 5 does not detect an abnormality in the driving circuit 2 and lets current flow between the first power source 20 and the lighting circuit 40 via the first semiconductor switches 10*a*, the control unit 5 turns on the third semiconductor switch 43 and turns off the fourth semiconductor switch 44 of the lighting circuit 40.

If the control unit 5 detects an abnormality of the driving circuit 2 and cannot turn on the first semiconductor switches 10*a*, the control unit 5 turns on the second semiconductor switch 10*b* and lets current flow between the first power source 20 and the lighting circuit 40 via the second semiconductor switch 10*b*. Thereafter, the control unit 5 turns off the third semiconductor switch 43 and turns on the fourth semiconductor switch 44 of the lighting circuit 40.

If the first power source 20 and the lighting circuit 40 are conductively connected via the second semiconductor switch 10*b*, the value of a current that flows through the light emitting elements 42 depends on the combined resistance of the resistor 4 connected in series with the second semiconductor switch 10*b*, the on-resistance of the second semiconductor switch 10*b*, and the on-resistance of the fourth semiconductor switch 44. For example, by setting the resistance value of the resistor 4 connected in series with the second semiconductor switch 10*b* to 49 Ω, and the resistance values of the on-resistances of the second semiconductor switch 10*b* and the fourth semiconductor switch 44 to 0.5Ω, the resistance value of the combined resistance can be set to 50Ω, and the value of current flowing through the light emitting elements 42 can be set to 0.2 A. Furthermore, due to the voltage drop due to the resistor 4 connected in series with the second semiconductor switch 10*b*, the value of voltage for turning on the second semiconductor switch 10*b* can be lower than the voltage output from the first power source 20, and it is no longer necessary to boost the voltage output from the first power source 20.

Figure 4:
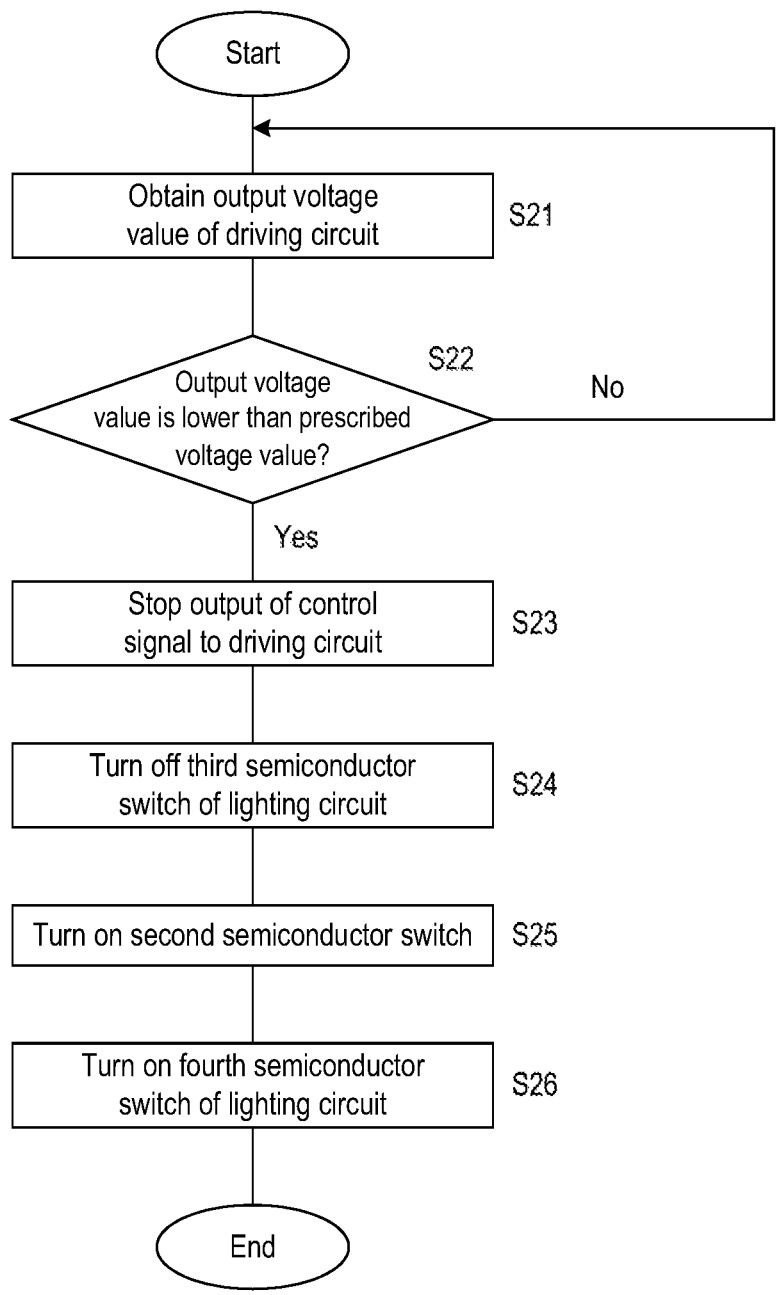
FIG. 4 is a flowchart showing a processing procedure performed by a control unit according to the second embodiment.

FIG. 4 is a flowchart showing a processing procedure performed by the control unit 5 according to the second embodiment. When the control unit 5 of the current flow control device 1 outputs the control signals to the driving circuit 2, the control unit 5 constantly executes the processing procedure described below. Since the procedure S21 to S23 is the same as the procedure from S11 to S13 of the first embodiment, the description thereof will be omitted.

The control unit 5 stops output of the control signal of the third semiconductor switch 43 of the lighting circuit 40 (S24). Similarly to the first embodiment, the control unit 5 turns on the second semiconductor switch 10*b* of the current flow control device 1 (S25). The control unit 5 outputs the control signal to the fourth semiconductor switch 44 of the lighting circuit 40 and turns on the fourth semiconductor switch 44 (S26).

In order to suppress thermorunaway, a constant current of 20 mA, that is a forward current, flows through the light-emitting element 42 such as an LED, for example. An appropriate forward current can be determined by setting the resistance values of the lighting circuit resistor 41 of the lighting circuit 40 and the resistor 4 of the current flow control device 1 to approximately the same resistance value. Furthermore, by performing control of the third semiconductor switch 43 and the fourth semiconductor switch 44 of the lighting circuit 40 interlocking with the control of the first semiconductor switches 10*a* and the second semiconductor switch 10*b*, even if there is an abnormality in the driving circuit 2 for turning on the first semiconductor switches 10*a*, power can be supplied from the first power source 20 to the lighting circuit 40 and the lighting circuit 40 can be turned on.

Third Embodiment

Figure 5:
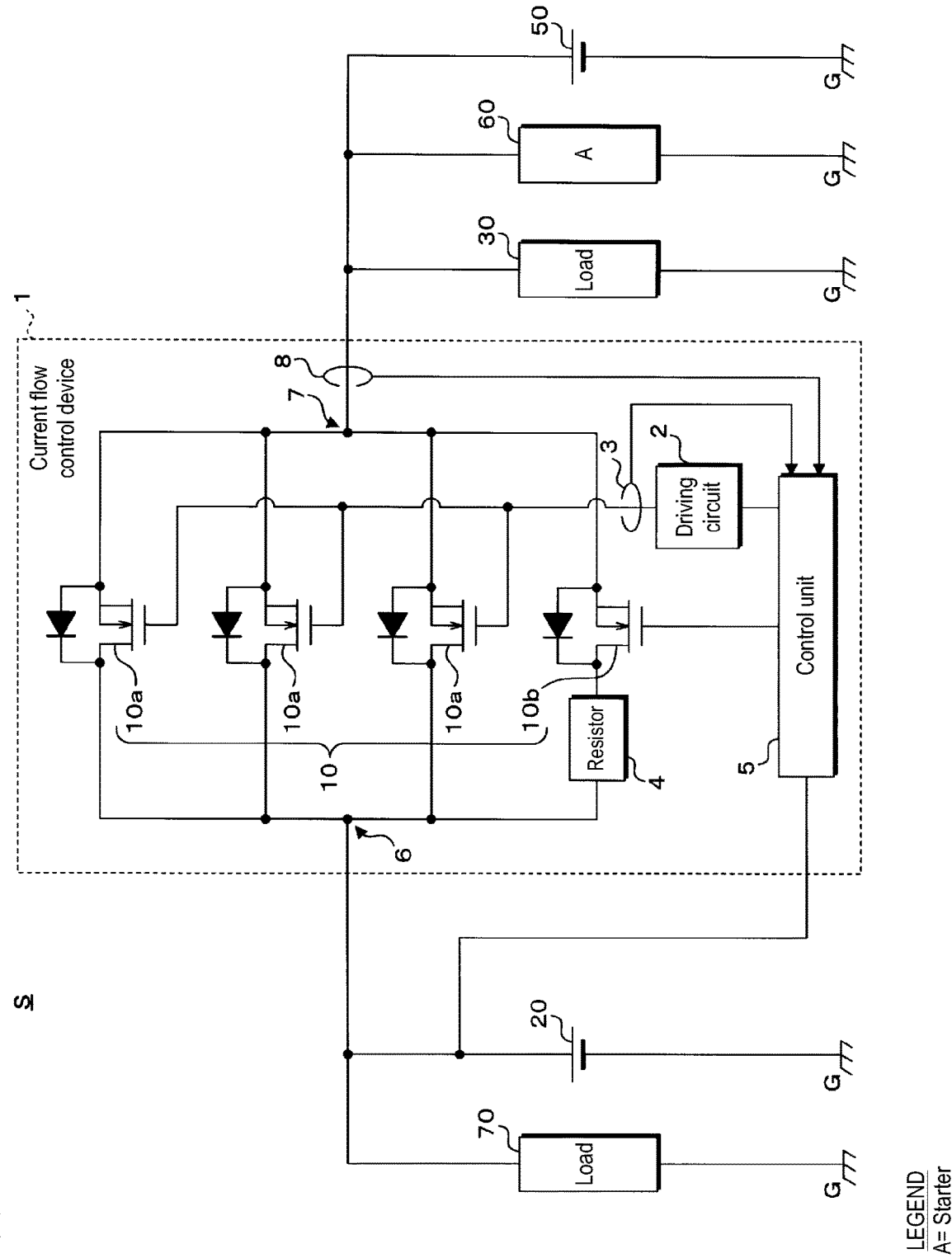
FIG. 5 is a block diagram showing a configuration of a main part of a power supply system according to a third embodiment.

FIG. 5 is a block diagram showing a configuration of a main part of a power supply system S according to a third embodiment. The third embodiment has the same configurations as that of the current flow control device 1 of the first embodiment aside from that the current flow control device 1 is provided with a voltage detection unit 8 that detects a voltage of the load side connection node 7. The power supply system S is provided, on the load 30 side, with a second power source 50 and a starter 60 connected in parallel with the load 30. In addition, a first power source side load 70 is connected in parallel with the first power source 20 on the first power source 20 side of the power supply system S. The other configurations, operations and effects are the same as in the first embodiment, and the same reference signs are given to the corresponding parts, and the description thereof will be omitted.

The second power source 50 is connected in parallel with the load 30 on the load 30 side, and similarly to the first power source 20, is a secondary battery such as a lead battery, a lithium ion battery, or the like. The second power source 50 functions as a constant voltage power source having the output voltage value of 12 V, for example. The value of voltage output from the second power source 50 is set to approximately the same as the value of the voltage output from the first power source 20.

The starter 60 is connected in parallel with the load 30 and the second power source 50 on the load 30 side, and starts a vehicle engine using power supplied from the second power source 50. Since the starter 60 requires a large current, when starting the engine, the voltage of the second power source 50 fluctuates. In view of this, in order to prevent the voltage fluctuation on the second power source 50 side from affecting the first power source 20 and the first power source side load 70, the control unit 5 turns off the plurality of the semiconductor switches 10 to disconnect the connection between the first power source 20 and the second power source 50. After the voltage of the second power source 50 has recovered, the control unit 5 turns on the plurality of semiconductor switches 10 and connects the first power source 20 and the second power source 50 to each other.

The voltage detection unit 8 detects the voltage of the load side connection node 7, and outputs the detected voltage value to the control unit 5. The control unit 5 determines whether the voltage of the load side connection node 7, that is, the value of the voltage output from the second power source 50, is less than or equal to a prescribed voltage value based on the obtained voltage value, and if the voltage is less than or equal to the prescribed voltage, turns on the second semiconductor switch 10b.

Figure 6:
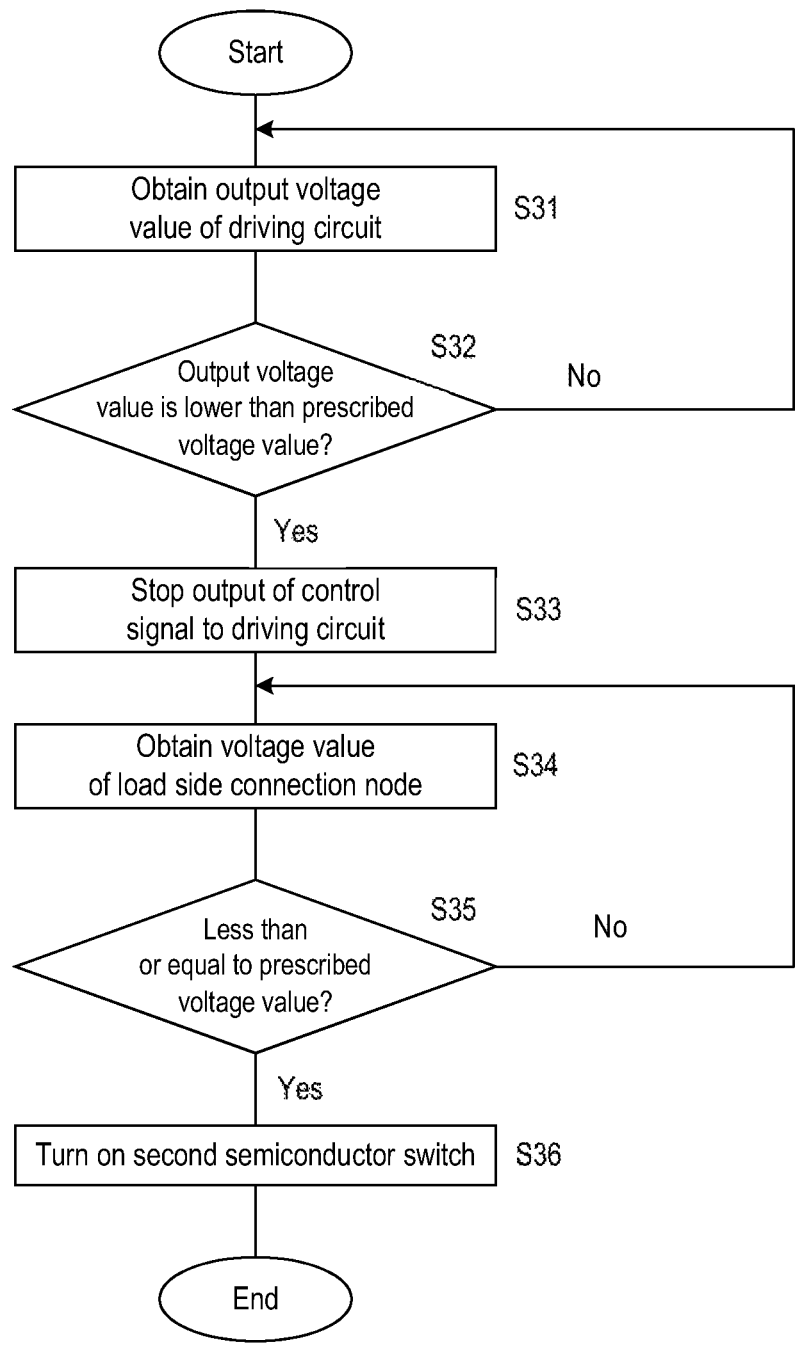
FIG. 6 is a flowchart showing a processing procedure performed by a control unit according to the third embodiment.

FIG. 6 is a flowchart showing a processing procedure performed by the control unit 5 according to the third embodiment. When the control unit 5 of the current flow control device 1 outputs the control signal to the driving circuit 2, the control unit 5 constantly executes the processing procedure described below. Since the procedure S31 to S33 is the same as the procedure S11 to S13 of the first embodiment, the description thereof will be omitted.

The control unit 5 obtains the voltage of the load side connection node 7, that is, the value of the voltage output from the second power source 50 (S34). The control unit 5 determines whether the obtained voltage value is less than or equal to a prescribed voltage value (S35). The prescribed voltage value is, for example, a discharge end voltage that is a characteristic of the second power source 50. A discharge end voltage is a voltage value at which the second power source 50 cannot discharge power any longer due to decrease in the power storage amount in the second power source 50. Accordingly, if the voltage of the second power source 50 decreases to the discharge end voltage, power cannot be supplied from the second power source 50 to the load 30.

If the obtained voltage value is not less than or equal to the prescribed voltage value (S35: NO), the control unit 5 returns the procedure to S34. If the obtained voltage value is less than or equal to the prescribed voltage value (S35: YES), the control unit 5 turns on the second semiconductor switch 10b (S36).

In the power supply system S with the above-described configuration, if there is an abnormality in the driving circuit 2 and the first semiconductor switches 10a cannot be turned on, power can be supplied to the load 30 from the second power source 50. If the amount of power stored in the second power source 50 decreases and the supply of power from the second power source 50 becomes insufficient, power can be supplied from the first power source 20 to the load 30.

The disclosed embodiments are illustrative examples in all aspects and should not be considered as restrictive. The scope of the present disclosure is defined not by the above description but by the claims, and is intended to encompass all modifications within the meanings and scope that are equivalent to the claims.

DRAWINGS

FIG. 1
1 Current flow control device
2 Driving circuit
4 Resistor
5 Control unit
30 Load FIG. 2 スタート Start
S11 Obtain output voltage value of driving circuit
S12 Output voltage value is lower than prescribed voltage value?
S13 Stop output of control signal to driving circuit
S14 Turn on second semiconductor switch エンド End FIG. 3
1 Current flow control device
2 Driving circuit
4 Resistor
5 Control unit
40 Load
41 Resistor FIG. 4 スタート Start
S21 Obtain output voltage value of driving circuit
S22 Output voltage value is lower than prescribed voltage value?
S23 Stop output of control signal to driving circuit
S24 Turn off third semiconductor switch of lighting circuit
S25 Turn on second semiconductor switch
S26 Turn on fourth semiconductor switch of lighting circuit エンド End FIG. 5
1 Current flow control device
2 Driving circuit
4 Resistor
5 Control unit
30 Load
60 Starter
70 Load FIG. 6 スタート Start
S31 Obtain output voltage value of driving circuit
S32 Output voltage value is lower than prescribed voltage value?
S33 Stop output of control signal to driving circuit
S34 Obtain voltage value of load side connection node
S35 Less than or equal to prescribed voltage value?
S36 Turn on second semiconductor switch エンド End

The invention claimed is:

1. A current flow control device comprising a plurality of semiconductor switches that are provided between a power source and a load and that are connected in parallel with each other, the current flow control device being configured to control the flow of current between the power source and the load by turning on and off the semiconductor switches,
wherein the plurality of semiconductor switches include a first semiconductor switch and a second semiconductor switch, and the current flow control device further includes:
a driving circuit configured to apply, to the first semiconductor switch, a voltage that is higher than a voltage that is output from the power source, to turn on the first semiconductor switch;
a switch control unit configured to turn on the second semiconductor switch;
a resistor that is connected in series with a terminal on the power source side of the second semiconductor switch, the resistor lowering a voltage applied to the terminal; and
an abnormality detection unit configured to detect an abnormality in the driving circuit, wherein, if the abnormality detection unit detects an abnormality in the driving circuit, the switch control unit turns on the second semiconductor switch.

2. The current flow control device according to claim 1, wherein a current capacity of the second semiconductor switch is smaller than a current capacity of the first semiconductor switch.

3. The current flow control device according to claim 1, wherein an on-resistance of the second semiconductor switch is greater than an on-resistance of the first semiconductor switch.

4. The current flow control device according to claim 1, wherein, in a state where the first semiconductor switch is turned off and the second semiconductor switch is turned on,
a value of a voltage drop due to the resistor is greater than a threshold voltage for turning on the second semiconductor switch.

5. The current flow control device according to claim 2, wherein an on-resistance of the second semiconductor switch is greater than an on-resistance of the first semiconductor switch.

6. The current flow control device according to claim 2, wherein, in a state where the first semiconductor switch is turned off and the second semiconductor switch is turned on,
a value of a voltage drop due to the resistor is greater than a threshold voltage for turning on the second semiconductor switch.

7. The current flow control device according to claim 3, wherein, in a state where the first semiconductor switch is turned off and the second semiconductor switch is turned on,
a value of a voltage drop due to the resistor is greater than a threshold voltage for turning on the second semiconductor switch.

8. A power supply system configured to supply power to a load, the power supply system comprising:
a power source;
a first semiconductor switch and a second semiconductor switch that are provided between the power source and the load, and that are connected in parallel with each other;
a driving circuit configured to apply, to the first semiconductor switch, a voltage that is higher than a voltage output from the power source;
a control unit configured to turn on the second semiconductor switch;
a resistor that is connected in series with a terminal on the power source side of the second semiconductor switch, the resistor lowering a voltage applied to the terminal; and
an abnormality detection unit configured to detect an abnormality in the driving circuit,
wherein, if the abnormality detection unit detects an abnormality in the driving circuit, the switch control unit turns on the second semiconductor switch.

* * * * *